(12) United States Patent
Awad et al.

(10) Patent No.: US 10,027,341 B2
(45) Date of Patent: Jul. 17, 2018

(54) MULTIPLE SAMPLING STAGE RECEIVER AND RELATED METHODS

(71) Applicant: MediaTek Inc., Hsin-Chu (TW)

(72) Inventors: Ramy Awad, Irvine, CA (US); Tamer Ali, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/433,493

(22) Filed: Feb. 15, 2017

(65) Prior Publication Data

US 2018/0054210 A1   Feb. 22, 2018

Related U.S. Application Data

(60) Provisional application No. 62/376,932, filed on Aug. 19, 2016.

(51) Int. Cl.
  *H03M 1/06* (2006.01)
  *H03M 1/12* (2006.01)
  *H03M 1/38* (2006.01)

(52) U.S. Cl.
  CPC ....... *H03M 1/1245* (2013.01); *H03M 1/0617* (2013.01); *H03M 1/38* (2013.01)

(58) Field of Classification Search
  CPC ..... H03M 1/1245; H03M 1/0617; H03M 1/38
  USPC ................ 341/122, 155, 120, 118
  See application file for complete search history.

(56) References Cited

U.S. PATENT DOCUMENTS

| 3,860,760 | A  | * | 1/1975  | Rittenbach | G01S 7/068 327/100 |
| 7,245,247 | B1 | * | 7/2007  | May | H03M 3/496 341/122 |
| 7,659,776 | B2 | * | 2/2010  | Rohilla | H03F 3/08 330/308 |
| 2008/0061877 | A1 |   | 3/2008  | Adut | |
| 2012/0268971 | A1 | * | 10/2012 | Kim | H02M 3/33523 363/21.17 |

OTHER PUBLICATIONS

Cui et al., A 320mW 32Gb/s 8b ADC-Based PAM-4 Analog Front-End with Programmable Gain Control and Analog Peaking in 28nm CMOS. ISSCC Dig. Tech. Papers. Feb. IEEE International Solid-State Ciruits Conference. Feb. 2016:58-59. 3pgs.

(Continued)

*Primary Examiner* — Peguy Jean Pierre
(74) *Attorney, Agent, or Firm* — Wolf, Greenfield & Sacks, P.C.

(57) ABSTRACT

A line receiver including an analog-to-digital converter is described. The line receiver may include an input stage, a first sampling stage, an integration stage, and a second sampling stage. The input stage may be configured to receive an input voltage representative of a signal transmitted by a transmitter, and to convert the input voltage to a current. The input stage may include a trans-conductance stage. The current may be sampled using the first sampling stage. The sampled current may be converted to a voltage using the integration stage. The integration stage may include a trans-impedance stage. The voltage obtained using the integration stage may be sampled using the second sampling stage.

22 Claims, 7 Drawing Sheets

(56) References Cited

OTHER PUBLICATIONS

Gopalakrishnan et al., A 40/50/100Gb/s PAM-4 Ethernet Transceiver in 28nm CMOS. ISSCC Dig. Tech. Papers. IEEE International Solid-State Ciruits Conference . Feb. 2016:62-63. 3pgs.
Kull et al., A 90GS/s 8b 667mW 64x Interleaved SAR ADC in 32nm Digital SOI CMOS. ISSCC Dig. Tech. Papers. IEEE International Solid-State Ciruits Conference. Feb. 2014:378-9. 3pgs.
Park et al., A 7Gb/s 9.3mW 2-Tap Current-Integrating DFE Reciever. ISSCC Dig. Tech. Papers. IEEE International Solid-State Ciruits Conference. Feb. 2007:230-1, 599. 3pgs.
Rylov et al., A 25Gb/s ADC-Based Serial Line Receiver in 32nm CMOS SOI. ISSCC Dig. Tech. Papers. IEEE International Solid-State Ciruits Conference. Feb. 2016:56-7. 3pgs.
Extended European Search Report for EP 17183870.9 dated Jan. 2, 2018.
Karvonen et al., A CMOS Quadrature Charge-Domain Sampling Circuit With 66-dB SFDR Up to 100 MHz. IEEE Transactions on Circuits and Systems Part I: Regular Papers, Feb. 2005;52(2):292-304.

\* cited by examiner

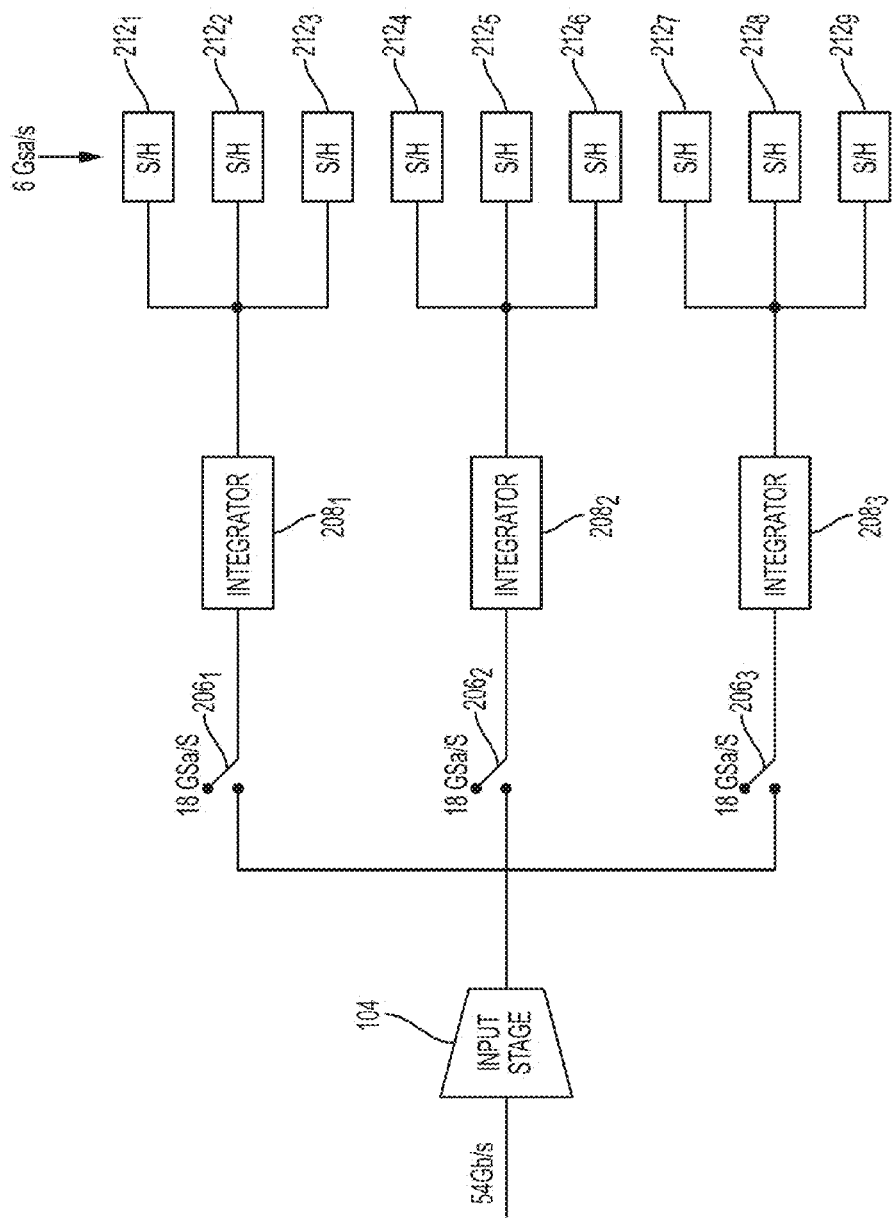

MULTIPLE SAMPLING STAGE RECEIVER AND RELATED METHODS

This Application claims priority under 35 U.S.C. § 119(e) to U.S. Provisional Application Ser. No. 62/376,932, entitled "LOW-VOLTAGE HIGH-SPEED ADC-BASED RECEIVER" filed on Aug. 19, 2016, which is herein incorporated by reference in its entirety.

BACKGROUND

Line receivers are used in electronics to receive signals transmitted through transmission lines. Some types of line receivers include analog-to-digital converters to convert the received signal into the digital domain.

BRIEF SUMMARY

According to one aspect of the present application, a line receiver is provided. The line receiver may comprise an input stage configured to receive an input signal and to generate an intermediate signal; a first sampling stage coupled to the input stage and configured to sample the intermediate signal at a first rate; an integration stage coupled to the first sampling stage and configured to integrate the sampled intermediate signal; and a second sampling stage coupled to the integrator stage and configured to sample the integrated sampled intermediate signal at a second rate.

In some embodiments, the integration stage comprises an amplifier and a capacitor coupled between an input terminal and an output terminal of the amplifier.

In some embodiments, the input terminal of the amplifier is clamped to a fixed potential.

In some embodiments, the amplifier has a gain that is greater than 1.

In some embodiments, the amplifier has a gain that is greater than or equal to 100.

In some embodiments, the input signal is a voltage and the intermediate signal is a current.

In some embodiments, the first sampling stage comprises a plurality of switches configured to sample the intermediate signal at different times.

In some embodiments, the integration stage comprises a plurality of integrators, each of the plurality of integrators being coupled to a respective switch of the plurality of switches.

In some embodiments, the line receiver further comprises an analog-to-digital converter configured to digitize the sampled integrated sampled intermediate signal.

In some embodiments, the line receiver lacks inductors having inductances greater than 0.25 nH.

In some embodiments, the first rate is greater than the second rate.

In some embodiments, the input stage is configured to generate the intermediate signal differentially.

In some embodiments, the input stage exhibits a transconductance gain greater than 1 mΩ$^{-1}$.

According to another aspect of the present application, a method for receiving an input voltage is provided. The method may comprise receiving and converting the input voltage into a current using an input stage; sampling the current at a first rate with a first sampling stage; integrating the sampled current with an integration stage; and sampling the integrated sampled current at a second rate with a second sampling stage.

In some embodiments, sampling the current with the first sampling stage is performed in a first period and integrating the sampled current with the integration stage is performed in a second period, wherein the first and the second periods partially overlap.

In some embodiments, the method further comprises digitizing the sampled integrated sampled current with an analog-to-digital converter.

According to yet another aspect of the present application, a line driver is provided. The line driver may comprise an input stage configured to receive an input signal and to generate a plurality of intermediate signals; a first set of switches coupled to the input stage and configured to sample respective intermediate signals of the plurality of intermediate signals; a plurality of integrators coupled to respective switches of the first set of switches and configured to integrate respective sampled intermediate signals; and a second set of switches coupled to an integrator of the plurality of integrators and configured, each of the second set of switches being configured to sample an integrated sampled intermediate signal.

In some embodiments, at least one of the plurality of integrators comprises an amplifier and a capacitor coupled between an input terminal and an output terminal of the amplifier.

In some embodiments, the input terminal of the amplifier is clamped to a fixed potential.

In some embodiments, the amplifier has a gain that is greater than 1.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 2B is a block diagram illustrating the line receiver of FIG. 2A configured to receive an input signal having a 54 Gb/s data rate, according to some non-limiting embodiments;

DETAILED DESCRIPTION

Figure 1:
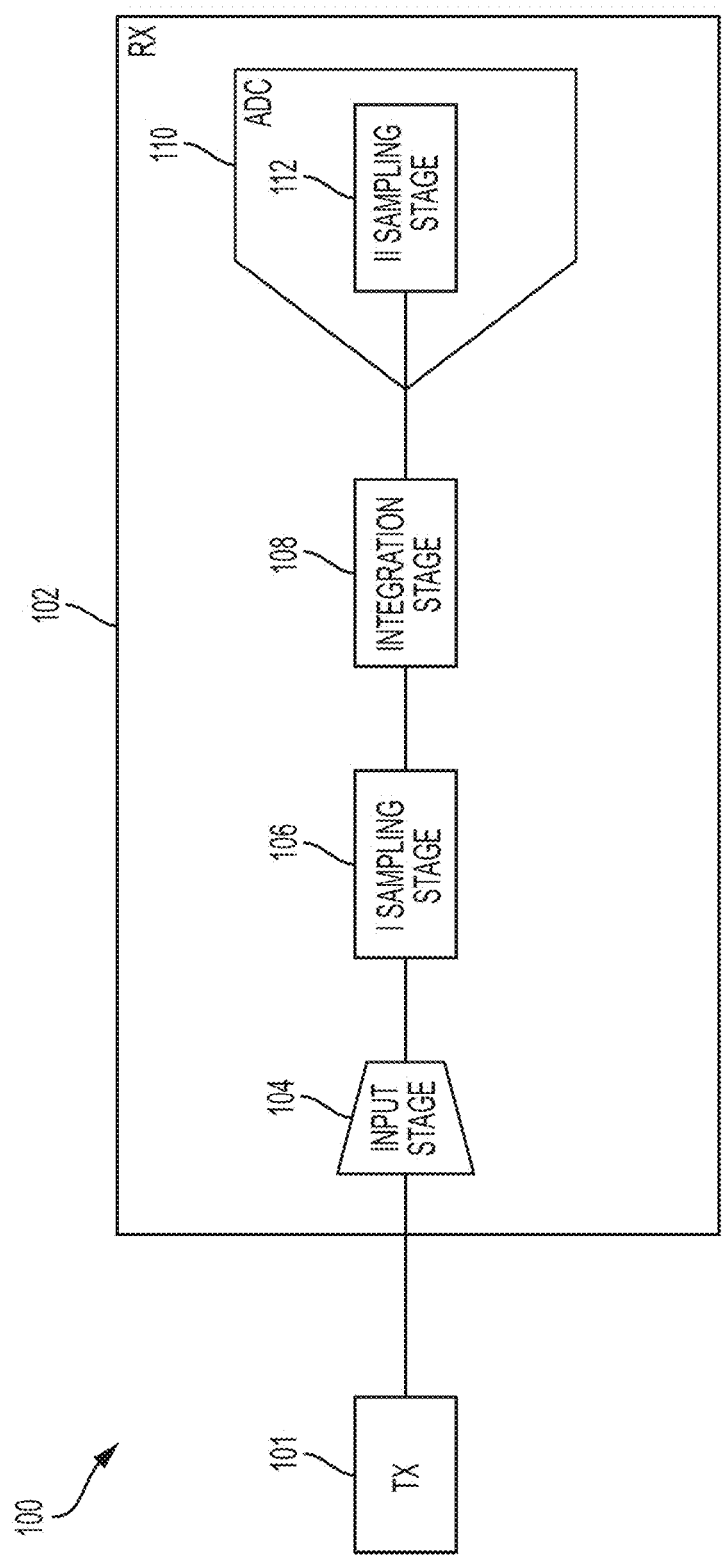
FIG. 1 is a block diagram illustrating a communication system, according to some non-limiting embodiments.

Discrete-time circuits, e.g., analog-to-digital converters, are often used in line receivers to sample the received signals. The inventors have recognized a challenge in the design of line receivers including discrete-time circuits that has risen as the size of integrated transistors decreases (e.g., as the complementary metal-oxide-semiconductor (CMOS) fabrication node decreases). Smaller transistors are less able to handle the voltage stresses, thus limiting the maximum voltage with which a circuit including such transistors can be supplied. As a result of this reduction in the supply voltage, the linearity of the line receivers is degraded. One of the reasons for such degraded linearity is the difficulty of biasing transistors in the linear region (e.g., a field effect transistor's saturation region or a bipolar transistor's active region) with a low supply voltage (e.g., less than 1V).

To overcome this limitation, some conventional line receivers utilize one or more signal buffers connected in series. The buffers, which provide a high input impedance and a low output impedance, are configured to operate at low supply voltages. However, the use of such buffers poses serious limitations on linearity, as well as on power consumption, bandwidth and sensitivity to process and temperature variations. Some of these conventional line receivers use large inductors (e.g., greater than 0.25 nH) to compensate for bandwidth degradations. However, the use of such inductors may be undesirable as it requires a significant portion of the area of the die.

Other conventional line receivers deal with the inability of small transistors to tolerate large supply voltage by separating a die into two portions: one portion includes an analog circuit configured to receive a high supply voltage (e.g., equal to or greater than 1V), and the other portion includes a digital circuit configured to receive a low supply voltage (e.g., lower than 1V). Due to the larger supply voltage received, the analog circuit provides the desired level of linearity. On the other hand, due to the lower supply voltage, the digital circuit can process digital signals without incurring stress. While this solutions provides the desired linearity, supplying a receiver with multiple voltages may be undesirable due to the added complexity.

The inventors have developed a line receiver that can provide the linearity desired for discrete-time signal processing while overcoming at least some of the drawbacks of prior solutions. The line receiver developed utilizes a plurality of sampling stages, disposed along the signal path, for sampling an input signal. By sampling an input signal in multiple stages, the bandwidth of the received signal may be increased without affecting the linearity of the line receiver. In some embodiments, the first sampling stage may be configured to sample a current representing the input signal, and the second sampling stage may be configured to sample a voltage representing the input signal. The inventors have appreciated that by sampling a current with the first sampling stage (e.g., rather than a voltage), the power consumed by the first sampling stage may be limited. As a result, bandwidth may be increased without necessarily sacrificing power consumption. Alternatively or additionally, bandwidth may be increased without having to resort to large inductors (e.g., having inductances greater than 1 nH, or greater than 10 nH). Such line receivers may find application in chip-to-chip interconnects, board-to-board interconnects, data center routers or switches, or cable interfaces.

FIG. 1 is a block diagram illustrating an example of a communication system, according to some non-limiting embodiments. Communication system 100 may comprise a transmitter (TX) 101 and a receiver (RX) 102. The transmitter 101 may be electrically coupled to the receiver 102 via a communication channel, such as cable (e.g., a twinax or a coax) and/or a metal trace on a printed circuit board. Other types of communications channels may alternatively be used. Transmitter 101 may be configured to transmit data at more than 10 Gb/s, more than 20 Gb/s, more than 30 Gb/s, more than 40 Gb/s, more than 50 Gb/s, or more than any other suitable value. In some embodiments, transmitter 101 may operate between 40 Gb/s and 80 Gb/s, or within any range within such range.

Receiver 102 may be configured to receive signals transmitted by transmitter 101 through the communication channel. In some embodiments, receiver 102 may include input stage 104, first sampling stage 106, integration stage 108 and analog-to-digital converter (ADC) 110. ADC 110 may include second sampling stage 112. Input stage 104 may generate an intermediate signal in response to receiving the signal provided by transmitter 101. In some embodiments, the input stage may receive a voltage representative of the signal transmitted by the transmitter. In response, a current representative of the signal provided by transmitter 101 may be generated. Therefore, the intermediate signal may be a current in some embodiments.

The intermediate signal may be sampled using the first sampling stage 106. The first sampling stage 106 may sample the intermediate signal at any suitable sampling rate, such as between 1 mega sample per second (MSa/s) and 100 giga sample per second (GSa/s), between 10 MSa/s and 60 GSa/s, between 100 MSa/s and 60 GSa/s, between 1 GSa/s and 60 GSa/s, between 10 GSa/s and 60 GSa/s, between 20 GSa/s and 60 GSa/s, between 20 GSa/s and 40 GSa/s, or within any suitable range within such ranges. The first sampling stage may be configured to achieve the desired sampling rate by using multiple switches disposed in parallel. These multiple switches may each provide a sampling rate lower than the desired sampling rate, and their sampling rates may be aggregated. By sampling a current, rather than a voltage, the requirements on the resistance of the switches may be relaxed. Switches configured to sample voltages provide sampling rates that are limited by the product of its resistance times its capacitance. As a result, it is desirable to reduce its resistance in order to provide a larger sampling rate. The reduction of its resistance is often achieved by increasing the size of the switch. However, increasing the size of the switch may be undesirable as it may occupy a larger portion of the space available on a die and/or may lead to a larger power consumption. Contrarily, the sampling rate of a switch configured to sample currents may not be limited by its resistance, and consequently the size of the switch may be reduced.

In some embodiments, the signal obtained with the first sampling stage may be integrated using integration stage 108. Integration of the sampled signal may be achieved in any suitable way, for example using a trans-impedance amplifier (TIA). As explained above, the intermediate signal may include a current representative of the signal transmitted by transmitter 101 in some embodiments. In such embodiments, the integration stage may be used to generate a voltage in response to receiving the current generated by input stage 104 and sampled by first sampling stage 106. This voltage may represent a sampled version of the signal transmitted by transmitter 101. In some embodiments, integration stage 108 may include multiple integrators. Any suitable number of integrators may be used. For example, one integrator may be used for each switch included in first sampling stage 106. However, other configurations may be used.

ADC 110 may convert the signal transmitted by transmitter 101 into the digital domain. ADC 110 may include any suitable type of ADC, such as a successive approximation (SAR) ADC, a flash ADC, a Wilkinson ADC, a multi-slope ADC, a delta-encoded ADC, a sigma-delta ADC, a time-interleaved ADC, or a pipeline ADC. The signal digitized using ADC 110 may be processed in any suitable way. For example, a processor (not shown in FIG. 1) may be coupled to ADC 110 and may be configured to filter, route, scale, analyze, check for errors, buffer, and/or store the digitized signal. Other functions may be performed. ADC 110 may include a second sampling stage 112. While the embodiment illustrated in FIG. 1 includes first and second sampling stages, the application is not limited to two sampling stages. In other embodiments, any other suitable number of sampling stages may be used (e.g., three sampling stages or more, four sampling stages or more, or five sampling stages or more). The sampling stages may be disposed in series along the data path associated with the signal received using receiver 102. The second sampling stage 112 may include multiple switches. In some embodiments, the multiple switches may be configured to sample voltages. In some of these embodiments, the second sampling stage may sample the voltages at a lower sampling rate compared to the sampling rate of the first sampling stage. In this way, the requirement for low resistance, and as a result larger area, of the second sampling stage may be relaxed. The second sampling stage 112 may sample the voltage received at any suitable sampling rate, such as between 1 KSa/s and 10 GSa/s, between 10 KSa/s and 1 GSa/s, between 100 KSa/s and 1 GSa/s, between 1 MSa/s and 1 GSa/s, between 1 MSa/s and 100 MSa/s, between 1 MSa/s and 50 MSa/s, between 1 MSa/s and 25 MSa/s, between 1 MSa/s and 10 MSa/s, or within any suitable range within such ranges. In some embodiments, the sampling rates of the first and second sampling stages may be aggregated to achieve a desired sampling rate. In this way, high data rates may be handled even if a single sampling stage does not have a sufficiently large sampling rate.

Figure 2A:
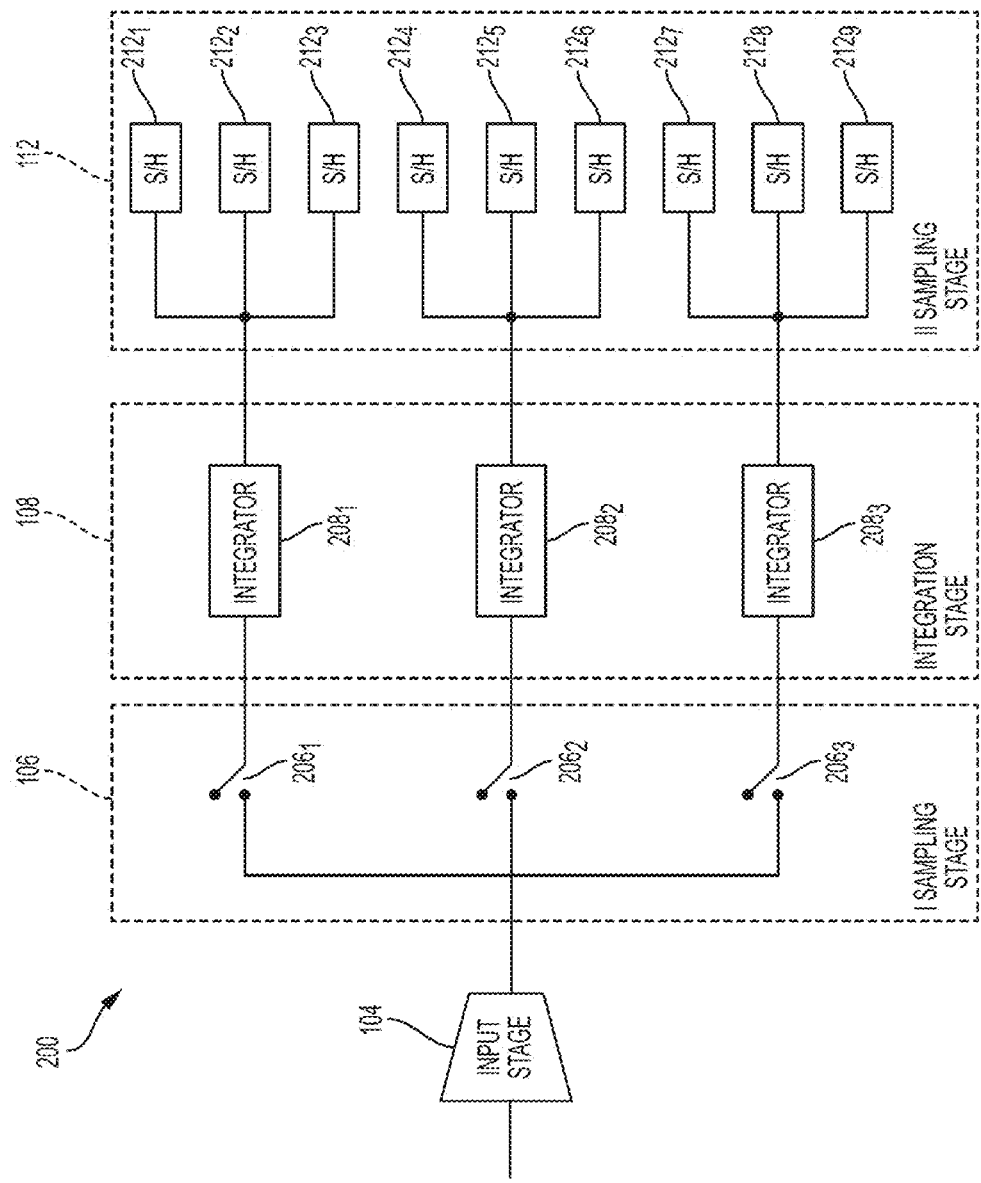
FIG. 2A is a block diagram illustrating a line receiver including a plurality of sampling stages, according to some non-limiting embodiments.

FIG. 2A illustrates one implementation of receiver 100, according to some non-limiting embodiments. Receiver 200 may include input stage 104, first sampling stage 106, integration stage 108, and second sampling stage 112. First sampling stage 106 may include multiple switches for sampling the signal provided by input stage 104. Any suitable number of switches may be used. For example, first sampling stage 106 may include switches $206_1$, $206_2$ and $206_3$. However, first sampling stage 106 is not limited to three switches. The switches may be implemented in any suitable way. For example, the switches may be implemented using one or more transistors, such as one or more bipolar junction transistors (BJT), one or more metal oxide semiconductor field effect transistor (MOSFET), one or more junction field effect transistor (JFET), or any suitable combination thereof. In some embodiments, the switches may sample the received signal at different time intervals. For example, switch $206_1$ may sample the received signal during a time interval $\Delta T_1$, switch $206_2$ may sample the received signal during a time interval $\Delta T_2$, and switch $206_3$ may sample the received signal during a time interval $\Delta T_3$. The intervals $\Delta T_1$, $\Delta T_2$ and $\Delta T_3$ may be non-overlapping in some embodiments, or may overlap partially.

Integration stage 108 may include any suitable number of integrators. For example, integration stage 108 may include integrators $208_1$, $208_2$ and $208_3$. However, integration stage 108 is not limited to three integrators. In some embodiments, the integrators may be configured to provide a signal that is proportional to the integral of the received signal. In some embodiments, the integrators may be used to convert a current into a voltage. For example, a current representative of a received signal may be transformed into a voltage representative of such a signal.

In some embodiments, second sampling stage 112 may include multiple switches. In some embodiments, at least one of the integrators of integration stage 108 may be coupled to multiple switches. In the embodiment illustrated in FIG. 2A, second sampling stage 112 includes sample and hold (S/H) circuits $212_1$, $212_2$, $212_3$, $212_4$, $212_5$, $212_6$, $212_7$, $212_8$, and $212_9$. While each integrator is coupled to three S/H circuits in this example, other configurations are also possible. The S/H circuits may include a switch and a holder. The holder may be configured to retain the voltage sampled by the switch for a finite period of time. The holder may be implemented using a capacitor in some embodiments.

The non-limiting example of FIG. 2B illustrates receiver 200 configured to receive an input signal having a 54 Gb/s data rate. In this configuration, each switch of the first sampling stage may be configured to sample the received signal at a sampling rate given by the input data rate divided by the number of switches. In this example, each switch of the first sampling stage samples at 18 GSa/s. The samples obtained through the first sampling stage may be further sampled using the switches of second sampling stage. In this configuration, each switch of the second sampling stage may be configured to sample the received signal at a sampling rate given by the sampling rate of a switch of the first sampling stage divided by the number of switches in the second sampling stage. In this example, each switch of the second sampling stage samples at 6 GSa/s. As illustrated, a receiver may be arranged in an interleaved configuration in some embodiments. In an interleaved configuration, a switch of the first sampling stage is coupled to multiple switches in the second sampling stage. As a result, the switches of the first sampling stage may be configured to sample at a larger sampling rate than the switches of the second sampling stage. As described above, by sampling a current rather than a voltage with the first sampling stage, a larger sampling rate may be achieved without having to increase the size of the switches.

In some embodiments, an input voltage representative of the signal transmitted by transmitter 101 may be converted into a current using a trans-conductance stage. This current may be sampled using a first sampling stage, and the sampled current may be converted into a voltage using a trans-impedance stage.

Figure 3:
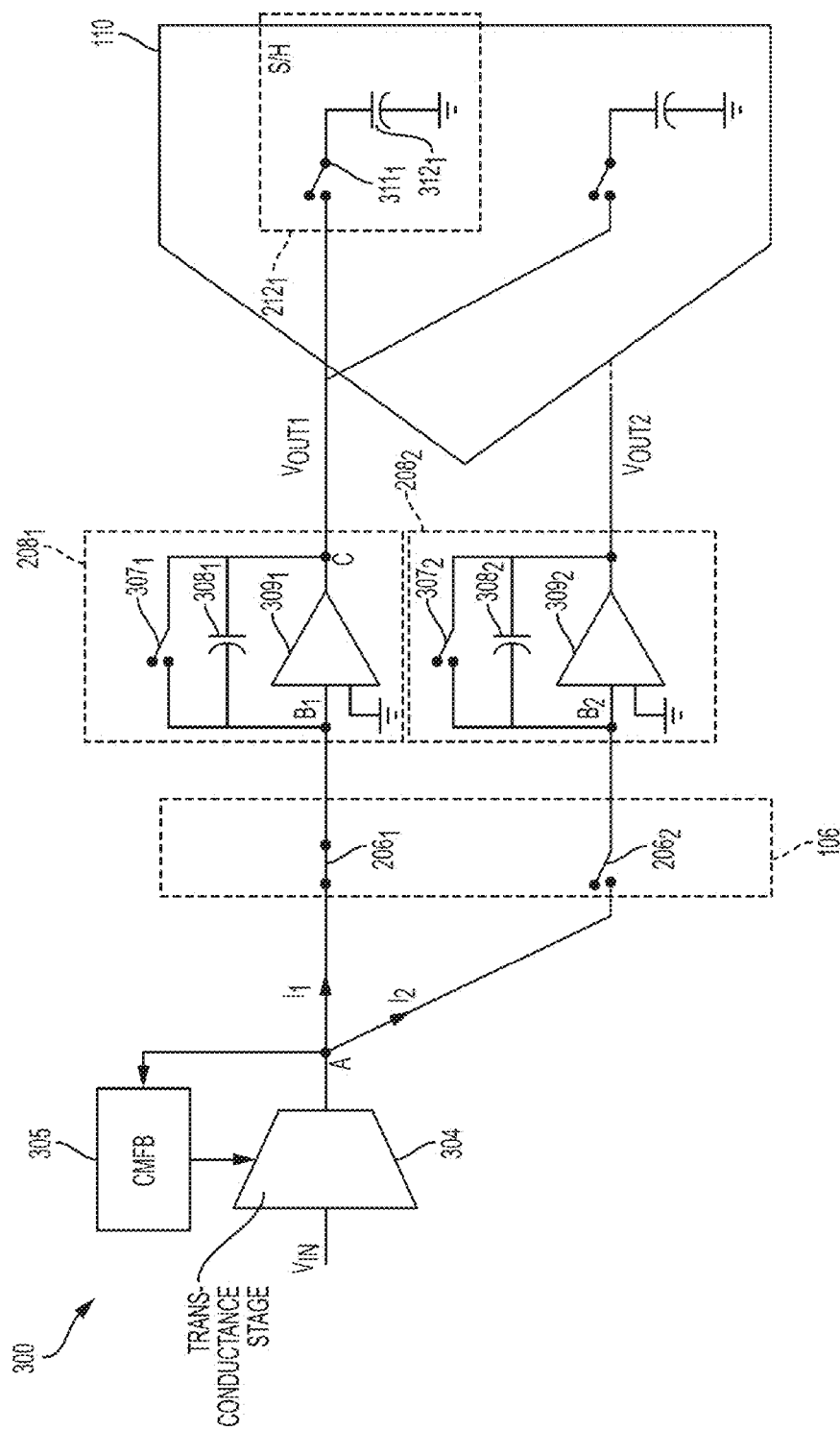
FIG. 3 is a block diagram illustrating another line receiver including a plurality of sampling stages, according to some non-limiting embodiments.

FIG. 3 is a block diagram illustrating a receiver including a trans-conductance stage, according to some non-limiting embodiments. Receiver 300 may include trans-conductance stage 304, which may serve as input stage 104. Receiver 300 may further include first sampling stage 106, integration stage 108 and second sampling stage 112. For the sake of clarity, only two of the switches of the first sampling stage and only two integrators are illustrated. However, receiver 300 is not limited in this respect. Similarly, only two switches of the second sampling stage are illustrated as being coupled to an integrator. However, any suitable number of switches may be coupled to an integrator.

In some embodiments, the trans-conductance stage 304 may receive a voltage and may generate a current. The generated current may be proportional to the received voltage in some embodiments. The trans-conductance stage may be implemented in any suitable way. For example, it may include a complementary metal oxide semiconductor (CMOS) inverter, or a transistor arranged in a common-source or a common-emitter configuration. Trans-conductance stage 304 may exhibit any suitable trans-conductance gain, such as between $1\ \mu\Omega^{-1}$ and $1\ \Omega^{-1}$ between $10\ \mu\Omega^{-1}$ and $100\ m\Omega^{-1}$, between $10\ \mu\Omega^{-1}$ and $10\ m\Omega^{-1}$, between $100\ \mu\Omega^{-1}$ and $10\ m\Omega^{-1}$, between $1\ m\Omega^{-1}$ and $10\ m\Omega^{-1}$, between 1 mΩ$^{-1}$ and 1 Ω$^{-1}$, between 10 mΩ$^{-1}$ and 1 Ω$^{-1}$, between 100 mΩ$^{-1}$ and 1 Ω$^{-1}$, or between any suitable range within such ranges. In some embodiments, the line receiver may lack inductors having inductances greater than 0.1 nH, greater than 0.25 nH, greater than 0.5 nH or greater than 1 nH.

In some embodiments, integrator $208_1$ may include amplifier $309_1$, capacitor $308_1$ and switch $307_1$. Amplifier $309_1$ and capacitor $308_1$ may collectively form a trans-impedance amplifier. Similarly, integrator $208_2$ may include amplifier $309_2$, capacitor $308_2$ and switch $307_2$. The open loop gain of the amplifiers $309_1$ and $309_2$ may be greater than 1, greater than 10, greater than 100, greater than 1000, or greater than 10000. In some embodiments, amplifiers $309_1$ and $309_2$ may each have a pair of input terminals. Input terminal "B1" of amplifier $309_1$ may be coupled to switch $206_1$ and input terminal "B2" of amplifier $309_2$ may be coupled to switch $206_2$. The other input terminals may be coupled to a reference supply voltage (e.g., to a ground terminal). In operation, the input terminals of the amplifiers may be held at approximately the same potential through a virtual short. In this way, the voltage of node "B$_1$" (or the voltage of node "B$_2$") may remain substantially constant (e.g., having fluctuations that are less than 10 mV in amplitude, less than 1 mV, less than 100 µV, less than 10 µV, or less than 1 µV).

When switch $206_1$ is in a closed state (e.g., a conductive state), node "A" may be coupled to node "B$_1$". In some circumstances it may be desirable to prevent the voltage of node "A" from decaying, which may be caused in some circumstances by variations in the common mode output signal of the input stage. By holding node "A" to a substantially constant potential, decaying of its value may be prevented.

Figure 4A:
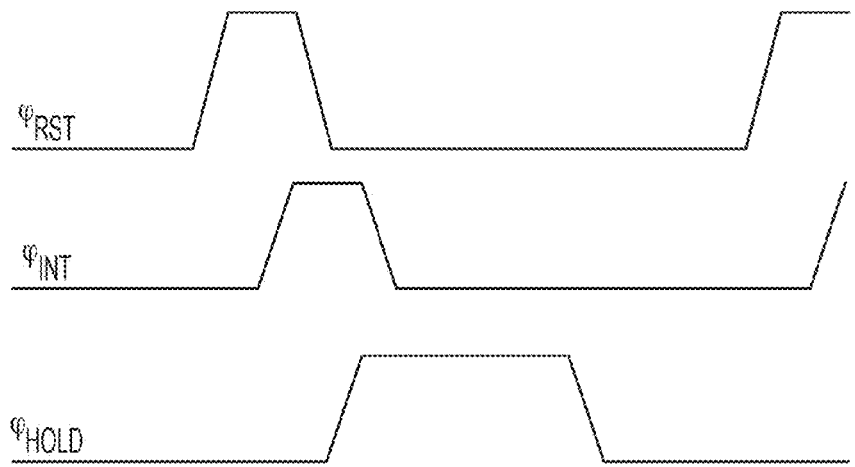
FIG. 4A is a plot illustrating a plurality of control signals, according to some non-limiting embodiments.

Receiver 300 may be controlled using a plurality of control signals. The control signals may control the state of the switches (e.g., on or off). FIG. 4A is a plot illustrating a plurality of control signals used in connection with receiver 300, according to some non-limiting embodiments. Control signal $\phi_{rst}$ may be used to control the state of switch $307_1$, $\phi_{int}$ may be used to control the state of switch $206_1$, and $\phi_{hold}$ may be used to control the state of switch $311_1$. According to the convention used herein, when the value of a control signal is "high", the corresponding switch is in an on-state (e.g., a conducting state). Contrarily, when the value of a control signal is "low", the corresponding switch is in an off-state (e.g., a non-conducting state).

When $\phi_{rst}$ is "high", switch $307_1$ may be in an on-state, thus resetting the charge retained in the capacitor $308_1$. When $\phi_{int}$ is "high", switch $206_1$ may be in an on-state, thus allowing the current generated by trans-conductance stage 304 to reach node "B$_1$". In some embodiments, amplifier $309_1$ may exhibit a large input impedance (e.g., greater than 10 KΩ, greater than 100 KΩ, greater than 1 MΩ, or greater than 10 MΩ). As a result, the majority (e.g., more than 80%, more than 90%, more than 95% or more than 99%) of the current reaching node "B$_1$" may be directed to capacitor $308_1$. When a current flows through the capacitor, the resulting charge of the capacitor, and consequently the voltage at node "C" may be proportional to the integral of the current. In this respect, integrator $208_1$ may be viewed as a current-to-voltage converter. When $\phi_{hold}$ is "high", switch $311_1$ may be in an on-state, thus sampling the voltage provided by integrator $208_1$. During this time interval, capacitor $312_1$ may be charged until the voltage across its terminals is substantially equal to (e.g., 75% or more, 80% or more, 90% or more, 95% or more, 99% or more) the voltage provided by the integrator. The voltage across the terminals of the capacitor $312_1$ may be converted into the digital domain using the ADC.

Referring back to FIG. 3, receiver 300 may include common mode feedback (CMFB) circuit 305. CMFB circuit 305 may configured to maintain the voltage of node "A" substantially constant (e.g., having fluctuations that are less than 10 mV in amplitude, less than 1 mV, less than 100 µV, less than 10 µV, or less than 1 µV), even when all the switches coupling the trans-conductance stage to the integrators are in an off-state. In this way, decaying of the potential of node "A" may be prevented. CMFB circuit 305 may include circuitry to sense the voltage of node "A", and circuitry for driving trans-conductance stage 304 to restore the voltage of node "A" to a substantially constant value.

Figure 4B:
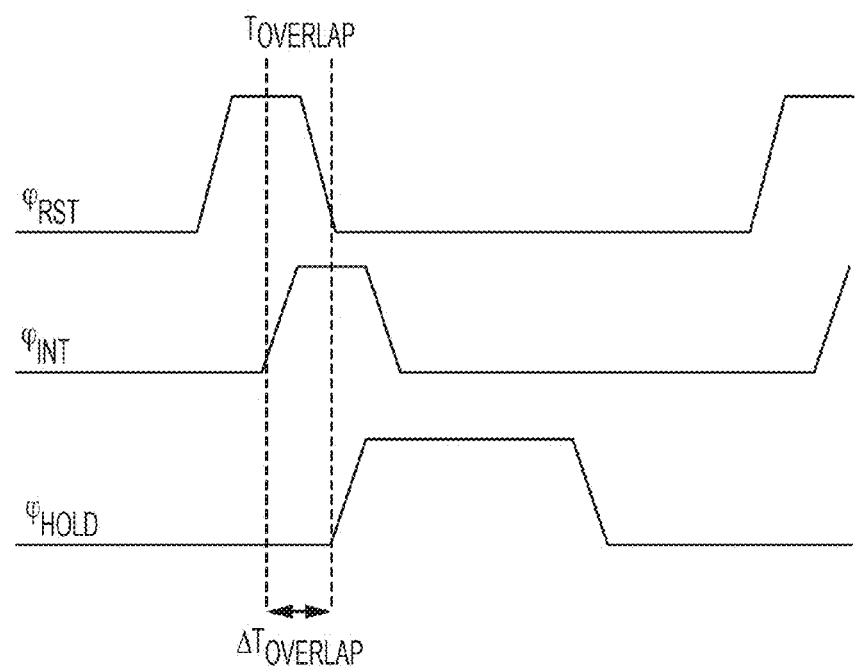
FIG. 4B is another plot illustrating a plurality of control signals, according to some non-limiting embodiments.

In some embodiments, the time interval when control signal $\phi_{rst}$ is "high" and the time interval when control signal $\phi_{int}$ is "high" may partially overlap, as illustrated in FIG. 4B. In this way, the duration of the integration window may be partially reduced. As a result, the insertion loss introduced by the integrator, which may depend on the duration of the integration window, may be decreased. In some embodiments, the duration of the overlap $\Delta T_{OVERLAP}$ may be between 10% and 40%, between 20% and 40%, or between 25% and 35% of the duration of a $\phi_{int}$ pulse.

Figure 5:
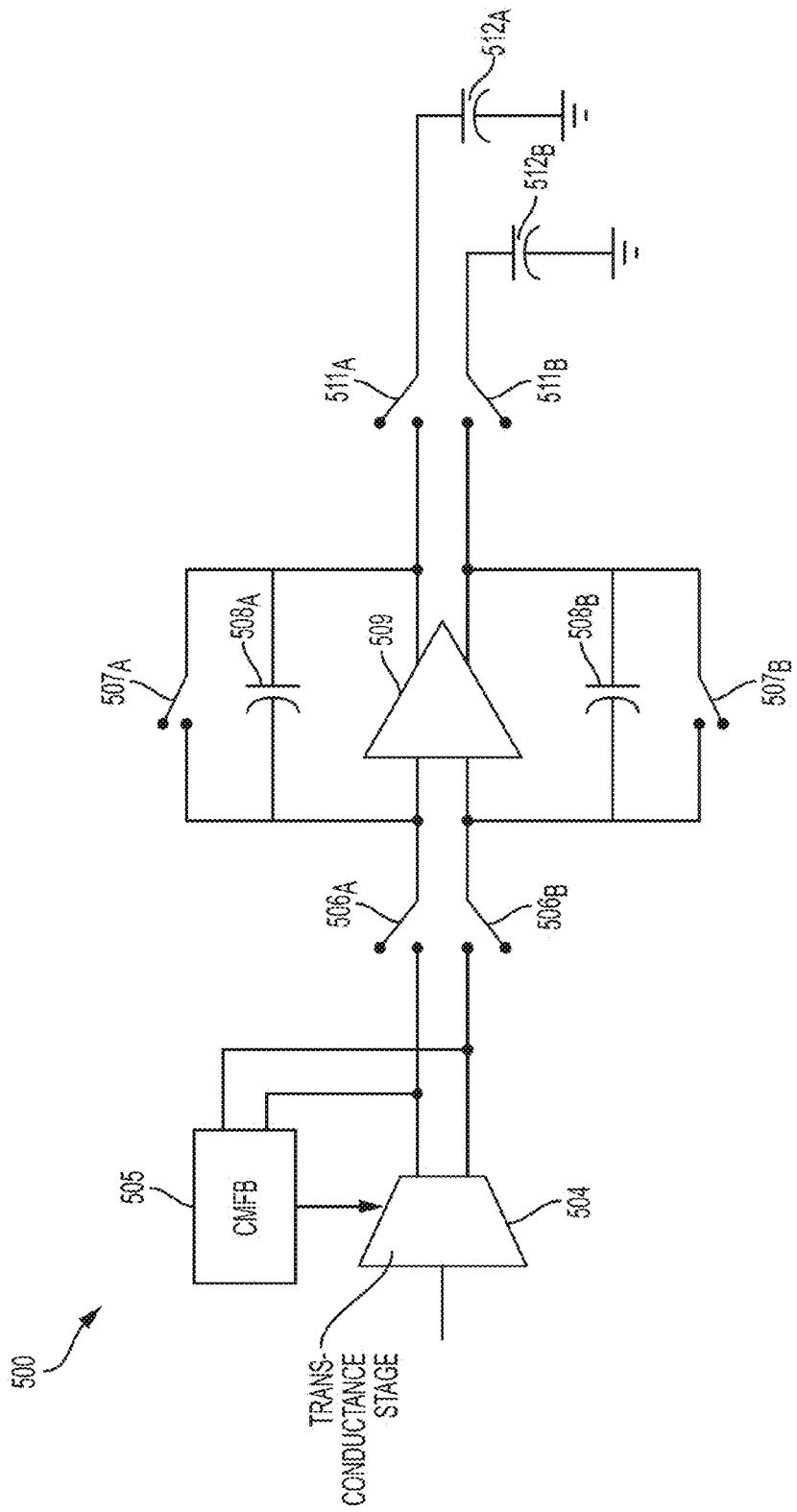
FIG. 5 is a plot illustrating a line receiver configured to operate differentially, according to some non-limiting embodiments.

The receiver described in connection with FIG. 3 may operate as a single ended circuit in some embodiments. However, the application is not limited in this respect and differential configurations may be used alternatively. FIG. 5 illustrates a receiver 500 configured to operate differentially. In the non-limiting example, one only integrator is illustrated for the sake of clarity. However, it should be appreciated that any number of integrators may be used, as described in connection with FIG. 3. Receiver 500 may include trans-conductance stage 504, which may provide a differential output. Trans-conductance stage 504 may exhibit the same characteristics as trans-conductance stage 304. The output terminals of trans-conductance stage 504 may be coupled to the input terminals of amplifier 509 via switches $506_A$ and $506_B$. The switches may sample currents flowing between the trans-conductance stage and the amplifier. Amplifier 509 may exhibit the same characteristics as amplifier $309_1$. The integrator may include amplifier 509, capacitors $508_A$ and $508_B$, and switches $507_A$ and $507_B$. The voltages at the output terminals of the amplifier may follow the integral of the currents provided to the respective input terminals. The output terminals of the amplifier may be coupled to capacitors $512_A$ and $512_B$ via switches $511_A$ and $511_B$ respectively. CMFB circuit 505 may be used to maintain the output terminals of the trans-conductance stage at substantially constant voltages, as described in connection with CMFB circuit 305.

Figure 6:
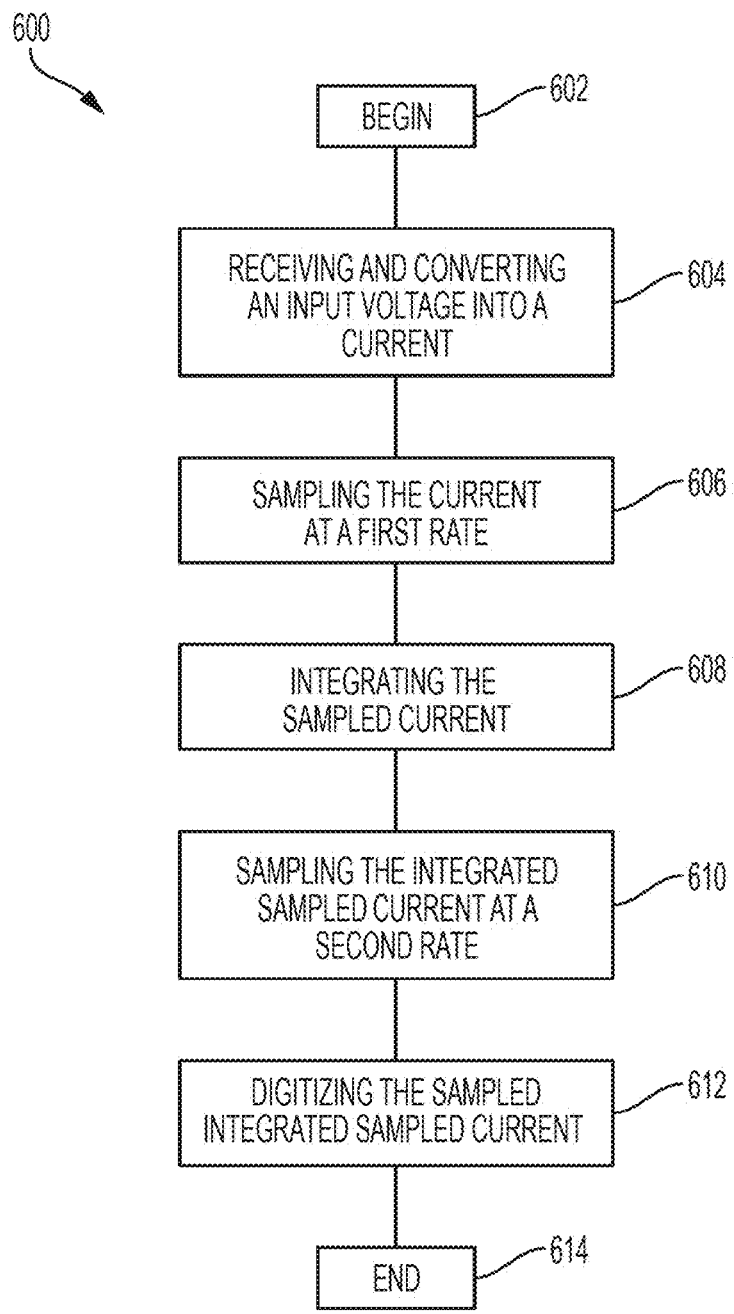
FIG. 6 is a flowchart illustrating a method for receiving an input voltage, according to some non-limiting embodiments.

FIG. 6 is a flowchart illustrating a method for receiving a signal, according to some non-limiting embodiments. Method 600 may begin at act 602. In some embodiments, at act 602, the integrator may be reset. At act 604, an input voltage may be received and may be converted to a current. The input voltage and the generated current may be representative of a signal transmitted by a transmitter. At act 606, the current may be sampled at a first rate. At act 608, the sampled current may be integrated. As a result, a voltage may be generated. At act 610, the integrated sampled current may be sampled at a second rate. In some embodiments, the first rate is larger than the second rate. At act 612, the sampled integrated sampled current may be digitized using an analog-to-digital converter. Method 600 may end at act 614.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A line receiver comprising:
   an input stage configured to receive an input signal and to generate an intermediate signal;
   a first sampling stage coupled to the input stage and configured to sample the intermediate signal at a first rate;
   an integration stage coupled to the first sampling stage and configured to integrate the sampled intermediate signal; and
   a second sampling stage coupled to the integrator stage and configured to sample the integrated sampled intermediate signal at a second rate,
   wherein the first sampling stage comprises a plurality of switches configured to sample the intermediate signal at different times and wherein the integration stage comprises a plurality of integrators, each of the plurality of integrators being coupled to a respective switch of the plurality of switches.

2. The line receiver of claim 1, wherein the integration stage comprises an amplifier and a capacitor coupled between an input terminal and an output terminal of the amplifier.

3. The line receiver of claim 2, wherein the input terminal of the amplifier is clamped to a fixed potential.

4. The line receiver of claim 2, wherein the amplifier has a gain that is greater than 1.

5. The line receiver of claim 2, wherein the amplifier has a gain that is greater than or equal to 100.

6. The line receiver of claim 1, wherein the input signal is a voltage and the intermediate signal is a current.

7. The line receiver of claim 1, further comprising an analog-to-digital converter configured to digitize the sampled integrated sampled intermediate signal.

8. The line receiver of claim 1, wherein the line receiver lacks inductors having inductances greater than 0.25 nH.

9. The line receiver of claim 1, wherein the first rate is greater than the second rate.

10. The line receiver of claim 1, wherein the input stage is configured to generate the intermediate signal differentially.

11. The line receiver of claim 1, wherein the input stage exhibits a trans-conductance gain greater than 1 m$\Omega^{-1}$.

12. A method for receiving an input voltage, the method comprising:
    receiving and converting the input voltage into a current using an input stage;
    sampling the current at a first rate with a first sampling stage;
    integrating the sampled current with an integration stage; and
    sampling the integrated sampled current at a second rate with a second sampling stage,
    wherein sampling the current with the first sampling stage is performed in a first period and integrating the sampled current with the integration stage is performed in a second period, wherein the first and the second periods partially overlap.

13. The method of claim 12, further comprising digitizing the sampled integrated sampled current with an analog-to-digital converter.

14. A line driver comprising:
    an input stage configured to receive an input signal and to generate a plurality of intermediate signals;
    a first set of switches coupled to the input stage and configured to sample respective intermediate signals of the plurality of intermediate signals;
    a plurality of integrators coupled to respective switches of the first set of switches and configured to integrate respective sampled intermediate signals; and
    a second set of switches coupled to an integrator of the plurality of integrators, each of the second set of switches being configured to sample an integrated sampled intermediate signal.

15. The line receiver of claim 14, wherein at least one of the plurality of integrators comprises an amplifier and a capacitor coupled between an input terminal and an output terminal of the amplifier.

16. The line receiver of claim 15, wherein the input terminal of the amplifier is clamped to a fixed potential.

17. The line receiver of claim 15, wherein the amplifier has a gain that is greater than 1.

18. A line receiver comprising:
    a voltage-to-current converter configured to receive an input voltage and to convert the input voltage into a current;
    a first sampling stage coupled to the voltage-to-current converter and configured to sample the current at a first rate;
    an integration stage coupled to the first sampling stage and configured to generate an intermediate signal by integrating the sampled current; and
    a second sampling stage coupled to the integrator stage and configured to sample the intermediate signal at a second rate,
    wherein the first sampling stage is configured to sample the current in a first period and the integration stage is configured to generate the intermediate signal by integrating the sampled current in a second period, wherein the first and the second periods partially overlap.

19. The line receiver of claim 18, further comprising an analog-to-digital converter configured to digitize the sampled intermediate signal.

20. The line receiver of claim 18, wherein the line receiver lacks inductors having inductances greater than 0.25 nH.

21. The line receiver of claim 18, wherein the first rate is greater than the second rate.

22. The line receiver of claim 18, wherein the integration stage comprises an amplifier having a gain that is greater than 1.

* * * * *